(12) United States Patent
Easwaran et al.

(10) Patent No.: US 7,570,191 B2
(45) Date of Patent: Aug. 4, 2009

(54) METHODS AND SYSTEMS FOR DESIGNING HIGH RESOLUTION ANALOG TO DIGITAL CONVERTERS

(75) Inventors: Prakash Easwaran, Bangalore (IN); Prasun Kali Bhattacharya, Burdwan (IN); Venkatesh Teeka Srinivasa Shetty, Bangalore (IN)

(73) Assignee: Cosmic Circuits Private Limited, Bangalore (IN)

( * ) Notice: Subject to any disclaimer, the term of this patent is extended or adjusted under 35 U.S.C. 154(b) by 0 days.

(21) Appl. No.: 11/760,778

(22) Filed: Jun. 10, 2007

(65) Prior Publication Data

US 2007/0285298 A1 Dec. 13, 2007

(51) Int. Cl.
*H03M 1/38* (2006.01)
(52) U.S. Cl. .................. 341/161; 341/155; 341/120
(58) Field of Classification Search ................ 341/155, 341/156, 161, 120
See application file for complete search history.

(56) References Cited

U.S. PATENT DOCUMENTS

| | | | | |
|---|---|---|---|---|
| 5,047,772 | A * | 9/1991 | Ribner | 341/156 |
| 5,220,326 | A | 6/1993 | Ledzius et al. | |
| 5,387,914 | A | 2/1995 | Mangelsdorf | |
| 6,396,429 | B2 * | 5/2002 | Singer et al. | 341/155 |
| 6,535,157 | B1 | 3/2003 | Garrity et al. | |
| 6,606,042 | B2 * | 8/2003 | Sonkusale et al. | 341/120 |
| 6,661,214 | B1 | 12/2003 | Hann et al. | |
| 6,734,818 | B2 * | 5/2004 | Galton | 341/161 |
| 6,825,790 | B2 | 11/2004 | Chou | |
| 6,891,493 | B2 | 5/2005 | Whittaker et al. | |
| 6,909,391 | B2 * | 6/2005 | Rossi | 341/161 |
| 6,963,300 | B1 | 11/2005 | Lee | |
| 7,158,443 | B2 | 1/2007 | Lin | |
| 7,248,199 | B2 | 7/2007 | Asano et al. | |
| 7,253,686 | B2 | 8/2007 | Ali | |
| 7,285,996 | B2 | 10/2007 | Fiedler | |
| 2004/0036453 | A1 * | 2/2004 | Rossi | 323/242 |
| 2005/0212575 | A1 | 9/2005 | Kim | |
| 2007/0030753 | A1 | 2/2007 | Kwak | |
| 2007/0046345 | A1 | 3/2007 | Tai et al. | |
| 2008/0054963 | A1 | 3/2008 | Masenas | |

FOREIGN PATENT DOCUMENTS

WO  WO 99/63414  12/1999

* cited by examiner

*Primary Examiner*—Jean B Jeanglaude
(74) *Attorney, Agent, or Firm*—Kanika Radhakrishnan; Evergreen Valley Law Group P.C.

(57) ABSTRACT

Methods and systems for designing a high resolution analog to digital converter (ADC) by eliminating the errors in the ADC stages. An error correction architecture and method eliminate the gain error and settling error of the residue amplifier in a pipelined ADC stage. A reference voltage error correction architecture and method eliminate the reference voltage error due to the sampling action in the ADC. The gain error correction method calculates the gain error using an error amplifier and eliminates the gain error at a later stage of the ADC. The reference voltage error correction method calculates the reference voltage error using an ideal reference voltage and corrects the error at a later stage of the ADC. Therefore, the constraints of gain and settling of the residue amplifier is significantly reduced.

20 Claims, 7 Drawing Sheets

METHODS AND SYSTEMS FOR DESIGNING HIGH RESOLUTION ANALOG TO DIGITAL CONVERTERS

CROSS-REFERENCE TO RELATED APPLICATIONS

This application claims priority to Indian Provisional Patent Application No. 1006/CHE/2006, filed Jun. 9, 2006, and Indian Non-Provisional Patent Application No. E/2/116/207, filed Jun. 8, 2007, which are incorporated herein by reference.

BACKGROUND

1. Technical Field

Embodiments of the invention relate generally to Analog to Digital Converters (ADCs) and more particularly to methods and systems for designing high resolution ADCs.

2. Discussion of Prior Art

Analog to Digital Converters (ADCs) serve to translate a given analog input signal (over a given range of potential signal values) into a corresponding digital signal. The prior art is replete with a host of different types of ADC architectures. They include, for example, flash architecture, pipelined architecture, successive approximation architecture and sigma delta architecture.

A pipelined ADC divides an analog-to-digital conversion task into several consecutive stages, namely, a sample and hold stage, followed by one or more pipeline stages, and finally a flash stage. The sample and hold stage samples and holds the analog input signal. It is followed by a set of pipelined stages. Each pipelined stage produces a digital estimate of an analog held signal received at an input of the stage. More particularly, at each pipelined stage, a digital estimate of the analog held signal is calculated, the digital estimate is then converted back to an analog waveform and is subtracted from the analog held signal received at the input of the stage. The result of the subtraction is referred to as residue value. The residual analog signal is then amplified in the hold phase and supplied to the next stage in the pipeline to be sampled and converted in an identical manner.

Each of the pipelined stages is constructed in an identical manner. That is, each includes a sample and hold circuit, an ADC, and a Digital to Analog (D/A) converter (DAC). The ADC uses two clock phases, namely, a sample phase and a hold phase for Analog to Digital (A/D) conversion. The sample phase is used to sample the input signal on the sampling capacitors. The input analog signal is the output voltage from the previous stage. For the hold phase, the input signal is the analog voltage which is supplied as an input to the ADC. The hold phase is used to calculate the residue value. The sampled input analog signal is subtracted from the nearest DAC value determined by the comparator array. The subtracted output is commonly referred to as residue value. The residual analog signal is then amplified in the hold phase and supplied to the next stage in the pipeline to be sampled and converted in an identical manner to stage 1. This process is repeated through as many stages as are necessary to achieve a desired resolution.

In conventional pipelined ADCs, errors created in one stage are propagated to the later stages. These errors are the key reason for reducing the performance of the ADC. Mainly there are two types of errors which reduce the performance of the ADC, namely gain error and reference voltage error. If the gain of the residue amplifier of a stage varies from the desired gain, there is a gain error in the residue amplifier which affects the residue value output of that particular stage.

Pipelined ADC requires a reference voltage to convert the analog input voltage into digital data. Given an input voltage sample Vin, the ADC output is D (a digital data) such that, $V_{in} = D*V_{ref} + Qer$; where '$V_{ref}$' is the reference voltage and Qer is the quantization error. 'Vref' is used in every stage of a pipelined ADC to extract the bits. A simplified diagram of a typical pipeline stage is illustrated in FIG. 1, 100.

Figure 1:
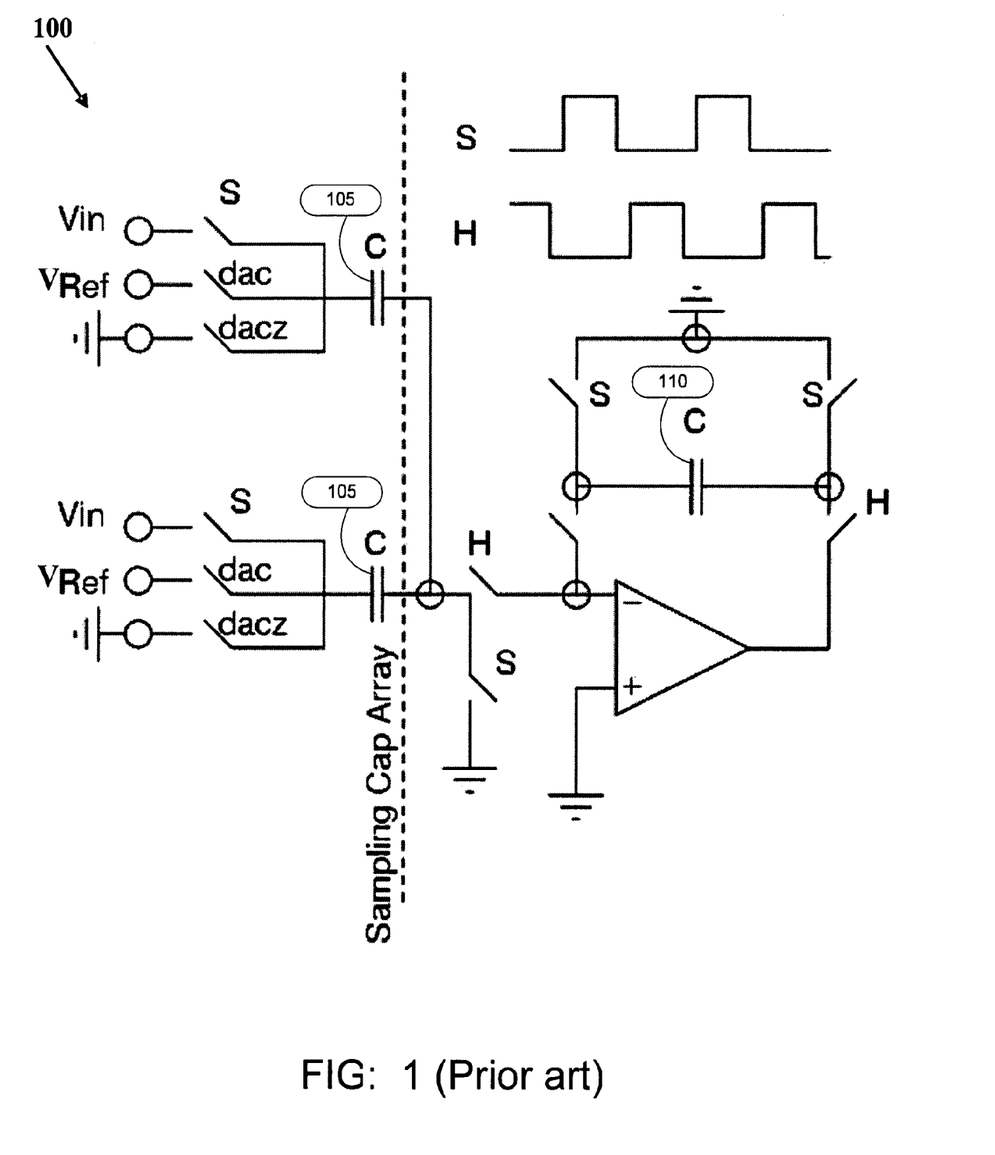
FIG. 1 illustrates a stage of a pipelined ADC according to the prior art.

In FIG. 1, in the sample phase of the clock, the sampling capacitors 105 sample the input voltage 'Vin'. In the hold phase of the clock, 'Vin' is subtracted from the nearest Digital to Analog Converter (DAC) value. A stage having 'n' number of DAC values has 'n' number of unit sampling capacitors 105. Depending on the comparator code, 'm' number of them are connected to 'Vref' in the hold phase, rest of the 'n-m' number of capacitors are connected to ground. The equivalent DAC value implemented is (m/n)*Vref. Charge drawn from the reference is m*C*(Vin−Vref), where 'C' is the unit sampling capacitance.

This charge is stored in the feedback capacitor 120 of the corresponding stage. The output voltage of the stage is Vres=G (Vin−Vref);

Where, the gain of the residue amplifier, G=m*C/Cf, and Cf=feedback capacitance.

This voltage is called the residue value of the corresponding stage and is used as the input voltage to the next stage to extract the following sets of bits. Error in residue value results in erroneous decision in the following stage and affects the digital code output of the entire ADC stages.

At the hold phase, the reference voltage, Vref dips due to the finite output impedance to supply the charge to the sampling capacitors 105. If the dip (or reference voltage error) in the reference voltage is 'Ve', the resultant error in residue value is Ver_res=−G*Ve. To reduce this reference voltage error, Ve needs to be reduced. To reduce Ve, the output impedance of the reference voltage Vref has to be reduced. To reduce the error in reference voltage, Vref to ¼LSB (Least Significant Bit) (480 uV) of a 12-bit ADC having IV reference voltage and 2 pF sampling capacitance at stage 1, the output impedance needs to be less than 1 ohm. This low output impedance across frequency is difficult to obtain, if not impossible, especially considering the reference voltage routing to every stages.

Most of the available ADCs today have a resolution of 8 bits. Relative to a 12-bit ADC, an 8-bit ADC has $\frac{1}{16}^{th}$ the resolution. In addition, the input sampling capacitance can be considerably reduced, as a result, the tolerable error in reference voltage is 16-times higher than that of an 8-bit converter and hence the effective output impedance can be as high as 16 ohm. However, such moderate output impedances are not acceptable in high resolution ADCs with 12 or more number of bits. There are several methods in the art for correcting these errors in the ADC in the digital domain. These methods are time consuming and cannot perform error correction in analog domain.

Hence, it would be advantageous to have a system and method for eliminating the gain error and reference voltage error in an ADC in the analog domain, thereby increasing the resolution of the ADC.

SUMMARY

Embodiments of the invention described herein provide methods and systems for designing a high resolution ADC by eliminating the errors in the ADC stages. An error correction architecture and method of the embodiments of the invention eliminate the gain error and settling error of the residue amplifier in a pipelined ADC stage. A reference voltage error correction architecture and method of the embodiments of the invention eliminate the reference voltage error due to the sampling action in the ADC.

An example method provides gain and settling error correction of the residue amplifier of a pipelined ADC according to an embodiment of the invention. The method divides an output signal (residue) of the first stage by a desired gain of the residue amplifier of the first stage using an attenuator and generates a modified output signal; adds the digital to analog converter (DAC) value to the modified output signal to generate a reconstructed input signal; and subtracts the reconstructed input signal from an input signal to the first stage for calculating a difference value between a desired output and an actual output. The difference value includes the error of the residue amplifier. The method further provides the error estimated to a second stage through an error amplifier after multiplying the error with the desired gain; and eliminates the error in the residue amplifier by adding the error to a residue value input to the second stage.

An example system provides an ADC architecture for gain and settling error correction of the residue amplifier of a pipelined ADC according to an embodiment of the invention. The ADC includes an attenuator for dividing an output signal of a first stage by a desired gain of the residue amplifier of the first stage to generate a modified output signal; means for adding DAC value to the modified output signal to generate a reconstructed input signal; means for subtracting the reconstructed input signal from an input signal to the first stage for calculating a difference value between a desired output and actual output, where the difference value includes the error; a sampling capacitor for holding the error calculated in the first stage; an error amplifier for providing the error calculated to a second stage of the plurality of stages after multiplying the error with the desired gain; and means for adding the error to a residue value input to the second stage whereby correcting the error in the residue amplifier.

An example method provides reference voltage error correction in the ADC according to an embodiment of the invention. The method calculates a reference voltage error in reference voltage provided to the first stage and an ideal reference voltage; and by multiplying the difference value with a closed loop gain of a residue amplifier of the first stage to calculate the reference voltage error. The method further provides the reference voltage error calculated to a second stage of the plurality of stages after multiplying the error with a closed loop gain of the residue amplifier of the second stage; and eliminates the reference voltage error by adding the error to a residue value input to the second stage.

An example system provides an ADC architecture for reference voltage error correction in the ADC according to an embodiment of the invention. The systems includes means for estimating a difference value between a reference voltage provided to a first stage of the plurality of stages and an ideal reference voltage; means for multiplying the difference value with a closed loop gain of a residue amplifier of the first stage to calculate a reference voltage error; means for providing the reference voltage error calculated to a second stage of the plurality of stages after multiplying the reference voltage error with a closed loop gain of the residue amplifier of the second stage; and means for eliminating the reference voltage error by adding the error to a residue value input to the second stage.

An example method provides reference voltage error correction in digital domain according to an embodiment of the invention. The method calculates a reference voltage error in a first stage of a plurality of stages in the ADC by estimating a difference value between a reference voltage provided to the first stage and an ideal reference voltage; and by multiplying the difference value with a closed loop gain of a residue amplifier of the first stage to calculate the reference voltage error, where the difference value includes the reference voltage error. The method further digitizes the reference voltage error calculated using a digital logic after multiplying the reference voltage error with a closed loop gain of the residue amplifier of the second stage; digitizes a residue value input to the second stage using an auxiliary ADC; and adds the digitized reference voltage error with the digitized residue value input using an error correction logic, which eliminates the reference voltage error.

Other aspects and example embodiments are provided in the Figures and the Detailed Description that follows.

BRIEF DESCRIPTION OF THE DRAWINGS

FIG. 4 is a flow diagram illustrating the steps in the method for reference voltage error correction in an ADC according to an embodiment of the invention;

DETAILED DESCRIPTION

FIG. 1 illustrates a stage of a pipelined ADC according to the prior art 100.

Figure 2:
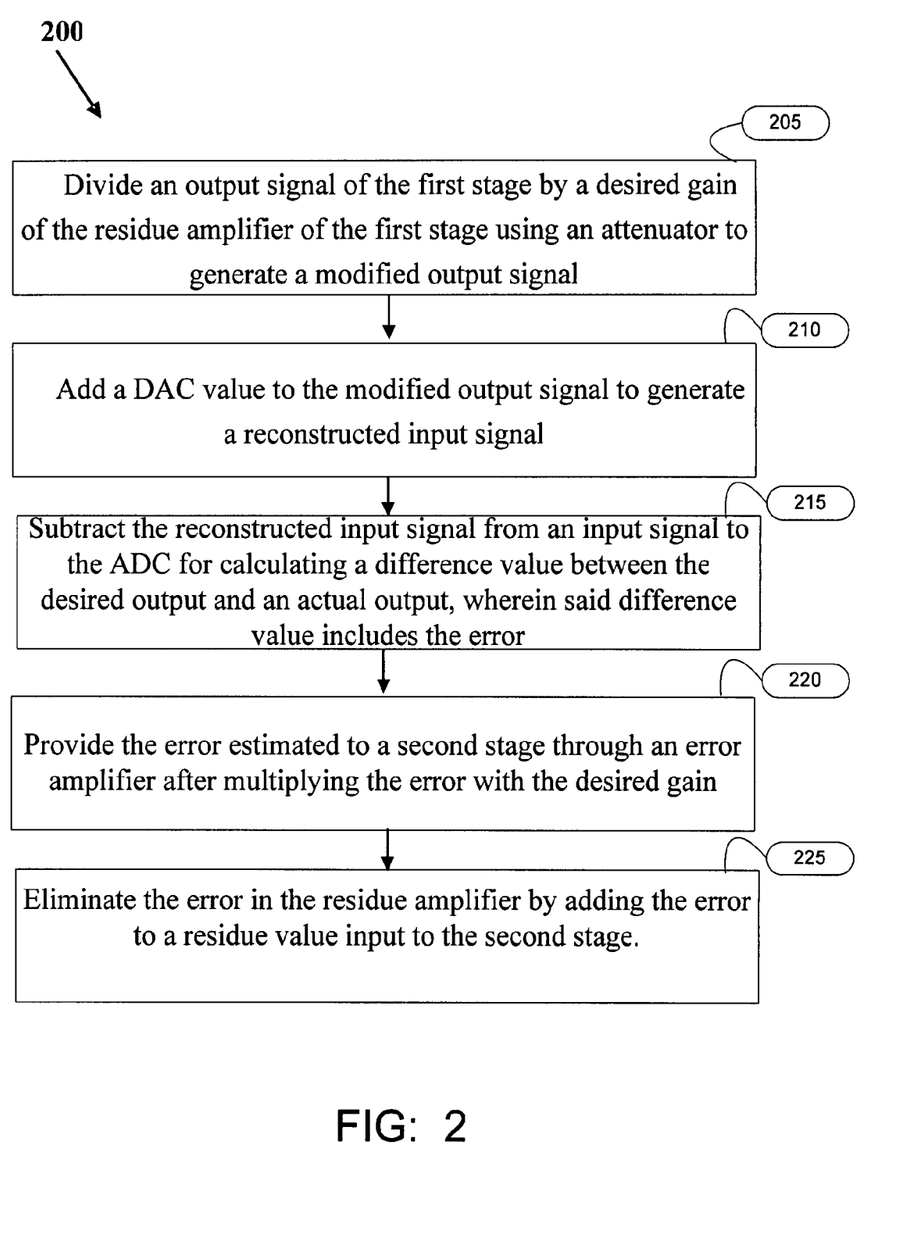
FIG. 2 is flow diagram illustrating the steps in the method for error correction in an ADC according to an embodiment of the invention.

FIG. 2 is flow diagram illustrating the steps in the method 200 for error correction in an ADC according to an embodiment of the invention. The error caused by a residue amplifier of a stage of the ADC is estimated while ADC is performing the analog to digital conversion, and is forwarded and corrected in the next stage. The error correction method uses an analog feed-forward approach where the error calculated is propagated and corrected in the analog domain at the later stages. Step 205 divides an output signal of the first stage by a desired gain of the residue amplifier of the first stage using an attenuator and generates a modified output signal. Step 210 adds the DAC value to the modified output signal and generates a reconstructed input signal. Step 215 subtracts the reconstructed input signal from an input signal to the ADC for calculating a difference value between the desired output and an actual output. The difference between the reconstructed input signal and the actual input signal is the error in the residue amplifier. This error includes the gain error or the settling error of the residue amplifier.

Step 220 provides the error estimated to a second stage through an error amplifier after multiplying the error with the desired gain. Since the error is provided to the second stage, the error itself has to be multiplied by the gain of the residue amplifier of the first stage. However, with an increased gain, the feedback factor of the second stage degrades significantly as there is a need for two sampling capacitors, one sampling capacitor for the residue amplifier output of the first stage and another for the error amplifier output. To reduce the feedback factor of the second stage, the closed loop gain of the error amplifier preset which is equal to the product of closed loop gains of the residue amplifiers of the first stage and the second stage. Multiplying the error with the desired gain cancels the divided value of the desired gain in step 205. Step 225 eliminates the error in the residue amplifier by adding the error to a residue value input to the second stage.

In order to effect the aforementioned error correction, a component which includes a measure of the error is required. The sampling capacitor of the stage is used for this purpose which holds the error. The sampling capacitor, at the end of the amplifying phase, holds a charge which corresponds to the difference value between the DAC value, and the desired residue value divided the desired gain of the residue amplifier.

In one embodiment of the invention, the aforementioned error correction method 200 can also be performed at a later stage in the ADC by propagating the error along a parallel path and added to the output of a subsequent stage. In such case, the error calculated is multiplied with the closed loop gains of a set of residue amplifiers of successive stages before a particular stage and is provided to that particular stage.

Figure 3:
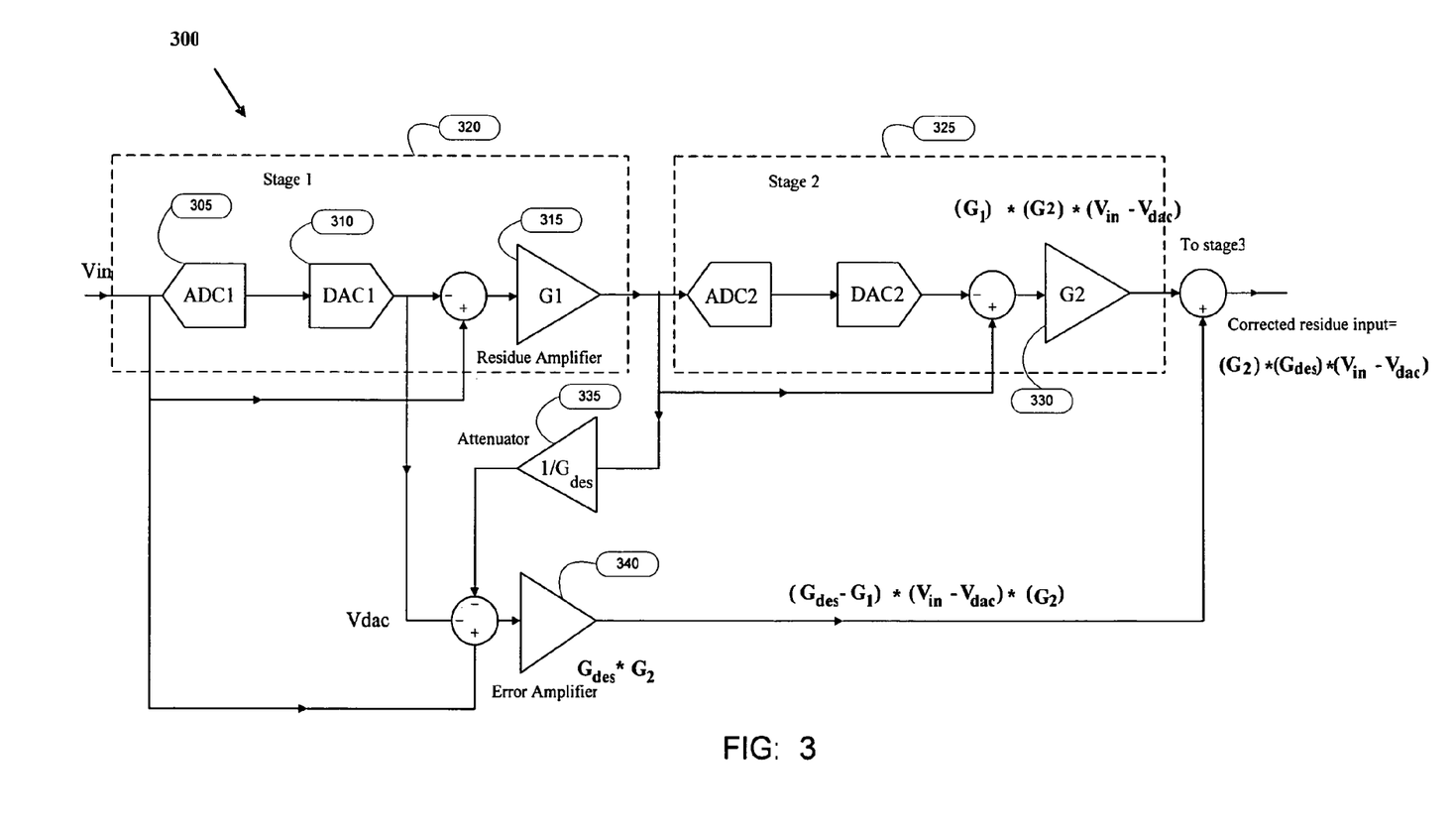
FIG. 3 is a block diagram illustrating an example implementation of the error correction method of FIG. 2 according to an embodiment of the invention.

FIG. 3 is a block diagram 300 illustrating an example implementation of the error correction method 200 of FIG. 2 according to an embodiment of the invention. The block diagram 300 includes two simplified stages of the ADC namely, first stage 320 and second stage 325. Each of these stages 320, 325 include an ADC 305, and a Digital to Analog Converter (DAC) 310. The first stage 320 includes a residue amplifier 315 with a closed loop gain of 'G$_1$' and the second stage 325 includes a residue amplifier 330 with a closed loop gain of 'G$_2$'. The block diagram further includes an attenuator 335 and an error amplifier 340.

The attenuator 335 divides the output of the first stage 320 by the desired gain of the residue amplifier 315 of the first stage 320. The desired gain is denoted as 'Gdes'.

The output of the first stage is given as,

Stage 1_output=$(V_{in}-V_{dac})G_1$;

Where, $V_{in}$=Input voltage to the first stage 320;

$V_{dac}$=DAC value of the first stage 320; and $G_1$=closed loop gain of the residue amplifier 315 of the first stage 320.

After dividing the output of the first stage 320 with the desired gain of the residue amplifier 315 using the attenuator 335, the output of the attenuator 335 is given as:

Attenuator_output=Stage1_output/$G_{des}$=$(V_{in}-V_{dac})G_1/G_{des}$;

Where, $G_{des}$=Desired Gain.

The output of the attenuator, 335 and the DAC value, 'Vdac' is subtracted from the input voltage 'Vin' and fed into the error amplifier 340. This value is multiplied by the desired gain 'Gdes'.

The output of the error amplifer,

-continued $$340 = [((V_{in} - V_{dac}) - \text{output of the attenuator, } 335)G_{des})] *$$
$$\text{closed loop gain of the error amplifier } 340;$$
$$= [((V_{in} - V_{dac}) - (V_{in} - V_{dac})G_1/G_{des})*G_{des}]*G_2;$$
$$= (G_{des} - G_1)*(V_{in} - V_{dac})*G_2.$$

The output of the error amplifier 340 is added to the residue value output of the second stage, 325.

Residue value output of the second stage, 325=$(V_{in}-V_{dac})*G_1*G_2$

Adding the output of the error amplifier 340 with the residue value output of the second stage 325 will be the corrected residue input to the third stage.

$$\frac{\text{The residue input}}{\text{to the third stage}} = \frac{\text{The output of the error amplifier+}}{\text{Residue value output of the second stage}}$$
$$= [(G_{des} - G_1)*(V_{in} - V_{dac})*G_2] +$$
$$[(V_{in} - V_{dac})*G_1*G_2]$$
$$= (V_{in} - V_{dac})*G_{des}*G_2$$

It is clear from the above equation that, the residue input to the third stage is multiplied by the desired gain of the residue amplifier of the first stage, Gdes.

FIG. 4 is a flow diagram illustrating the steps in the method 400 for reference voltage error correction in an ADC according to an embodiment of the invention. The method 400 of an embodiment of the invention corrects the reference voltage error due to the sampling action in the ADC. An ideal reference voltage is provided and the reference voltage error is calculated by taking the difference between the reference voltage provided to the first stage of the ADC and the ideal reference voltage.

Step 405 estimates a difference value between a reference voltage provided to the first stage and an ideal reference voltage. Step 410 multiplies the difference value with a closed loop gain of a residue amplifier of the first stage to calculate the reference voltage error. Step 415 provides the reference voltage error calculated to a second stage of the plurality of stages after multiplying the error with a closed loop gain of the residue amplifier of the second stage. Step 420 eliminates the reference voltage error by adding the error to a residue value input to the second stage.

Figure 5:
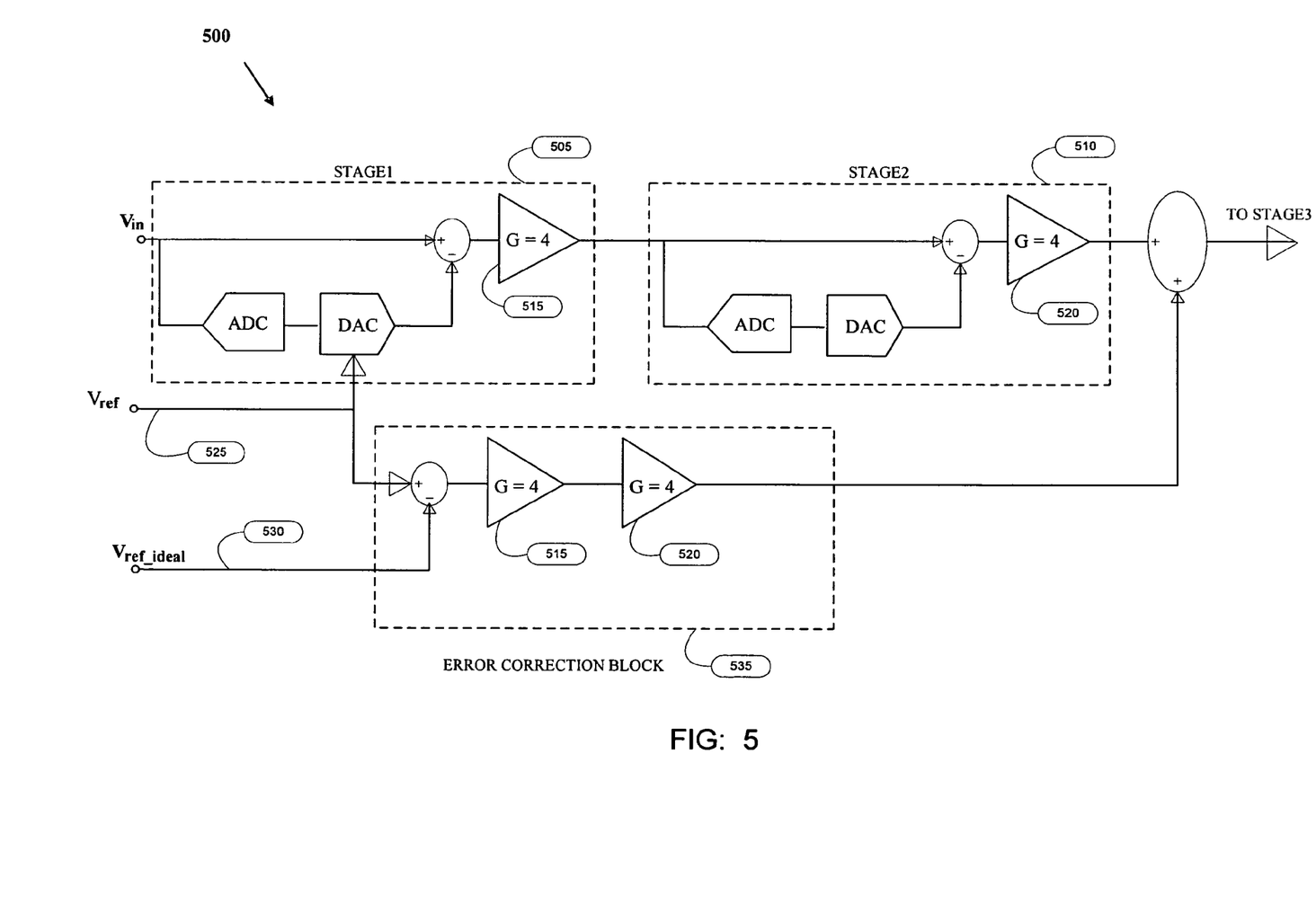
FIG. 5 is a block diagram illustrating an example implementation of the reference voltage error correction method of FIG. 4 according to an embodiment of the invention.

FIG. 5 is a block diagram 500 illustrating an example implementation of the reference voltage error correction method, 400 of FIG. 4 according to an embodiment of the invention. The block diagram 500 includes two simplified stages of the ADC namely, first stage 505 and second stage 510. Each of these stages 505, 510 includes an ADC, and a DAC. The first stage 505 includes a residue amplifier 515 with a closed loop gain of '4' and the second stage 510 includes another residue amplifier 520 with a closed loop gain of '4'. The block diagram further includes an error correction block 535.

The reference voltage to the first stage 505, Vref, 525 and an ideal reference voltage Vref_ideal, 530 is fed into the error correction block 535. In the error correction block 535, the ideal reference voltage Vref_ideal, 530 is subtracted from the reference voltage Vref, 525. This difference value is the reference voltage error. Reference voltage error is further multiplied by the closed loop gains of the residue amplifiers 515, 520 of the first and second stages 505, 510 respectively. In FIG. 5, 500 the closed loop gains of the residue amplifiers 515, 520 of the first and second stages 505, 510 are 'G=4'.

The output of the error correction block 535 is given as follows.

$$\begin{aligned}\text{Output of the}\\\text{error correction}\\\text{block}\end{aligned} = (V_{ref} - V_{ref\_ideal}) * \text{closed loop gains of the}$$
$$\text{residue amplifiers 515,}$$
$$\text{520 of the first and}$$
$$\text{second stages 505, 510.}$$
$$= (V_{ref} - V_{ref\_ideal}) * 16$$

The output of the error correction block 535 is added to the residue output of the second stage 510 for correcting the reference voltage error.

Residue output of the second stage, $510=(V_{in}-V_{ref})*16$;
Where, $V_{in}$=Input voltage to the first stage 505;
Adding the output of the error correction block 535 is added to the residue output of the second stage 510 gives the residue input to the next stage with corrected reference voltage.

$$\begin{aligned}\text{Input to the next stage} &= \text{Residue output of the second stage,}\\&\quad 510 + \text{output of the error correction}\\&\quad \text{block, 535;}\\&= [(V_{in} - V_{ref}) * 16] +\\&\quad [(V_{ref} - V_{ref\_idea}) * 16]\\&= (V_{in} - V_{ref\_ideal}) * 16.\end{aligned}$$

From the above result it is clear that the reference voltage error is eliminated and the ideal reference voltage 530 is provided to the next stage in the ADC. The charge drawn from the ideal reference voltage Vref_ideal 530 is only up to the error in the actual reference voltage Vref, 525. Hence, the output impedance of Vref_ideal 530 can be relaxed. Ideally, the output impedance of both Vref_ideal 530 and Vref 5252 is as relaxed as that needed for a 6-bit ADC; the error in Vref 525 will be equivalent to 1LSb of the 6-bit ADC, i.e., Vref=Vref/64. This 1LSB error when corrected by Vref_ideal 530 creates an error of Vref/64=Vref/(2^12) in Vref_ideal value. Thus, the final error is 12-bit small although each of the Reference buffers are only 6-bit accurate.

Figure 6:
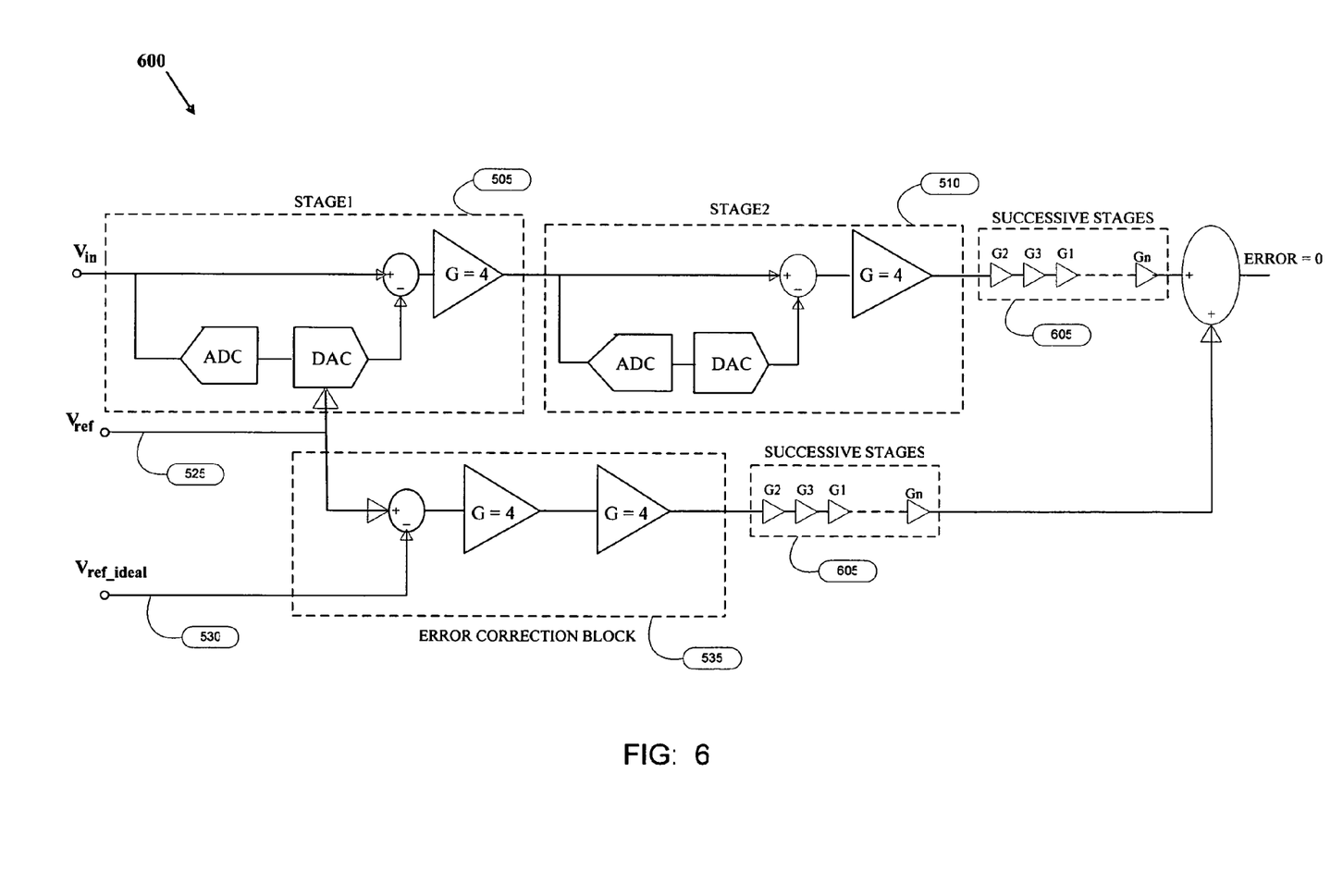
FIG. 6 is a block diagram illustrating an example implementation of the reference voltage error correction at a later stage in the ADC according to an embodiment of the invention.

FIG. 6 is a block diagram 600 illustrating an example implementation of the reference voltage error correction at a later stage in the ADC according to an embodiment of the invention. The reference voltage error can be eliminated at an immediate stage after estimating the reference voltage error as shown in FIG. 5, 500, or at a later stage as shown in FIG. 6, 600. While correcting the reference voltage at a later stage in the ADC, the reference voltage is estimated in a same way as explained in FIG. 5, 500. After estimating the reference voltage error, the output of the error correction block 535 is multiplied by the closed loop gains of the successive stages 605, for example G1 to Gn, till a particular stage and this value is added to that particular stage's residue value. In a similar manner, the reference voltage error can be eliminated at any stage of the ADC.

Figure 7:
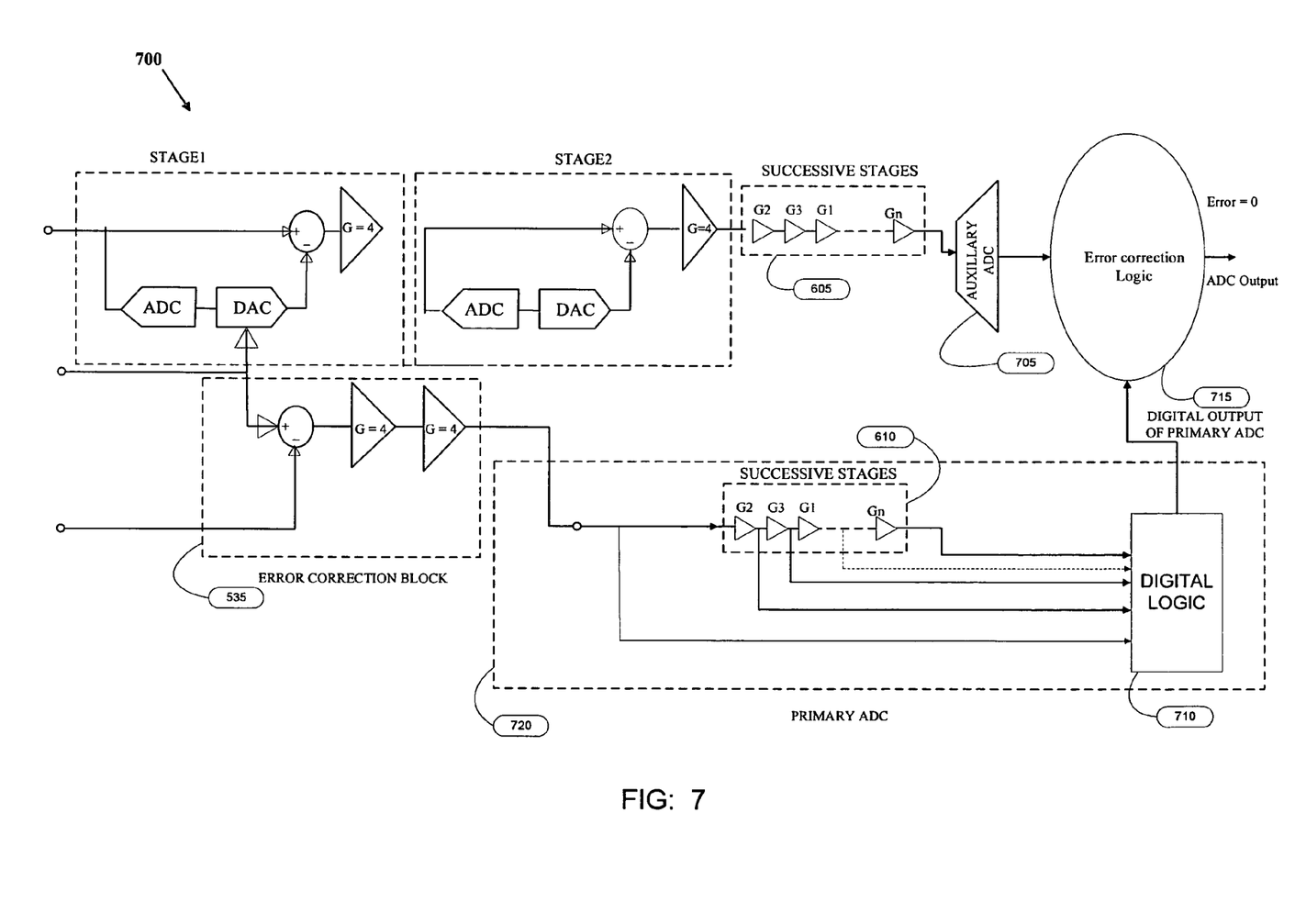
FIG. 7 is a block diagram illustrating an example implementation of the reference voltage error correction in digital domain according to an embodiment of the invention.

FIG. 7 is a block diagram 700 illustrating an example implementation of the reference voltage error correction in digital domain according to an embodiment of the invention. Instead of adding the reference voltage error in the analog domain as illustrated in FIG. 4, FIG. 5 and FIGS. 6, 400, 500 and 600, the output of the error correction block and the residue output of particular stage of the ADC can be digitized and then added. The residue output of the successive stages 605 is digitized using an auxiliary ADC 705. The output of the error correction block 535 is passed through a primary ADC 720. The primary ADC 720 includes a digital logic 710 to digitize the reference voltage error. The digital output of the primary ADC 720 and the residue output of the auxiliary ADC 705 are provided to the error correction logic 715. The error correction logic 715 adds these two digital inputs and eliminates the reference voltage error in digital domain.

The forgoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of above teachings, and it is thus intended that the scope of invention not be limited by this Detailed Description, but only by the following Claims.

What is claimed is:

1. A method comprising:
    estimating an error in a residue amplifier in a first stage of a plurality of stages in an analog to digital converter (ADC), wherein said estimating comprising:
        dividing an output signal of said first stage by a desired gain of the residue amplifier of the first stage using an attenuator to generate a modified output signal;
        adding a digital to analog converter (DAC) value to said modified output signal to generate a reconstructed input signal; and
        subtracting said reconstructed input signal from an input signal to the first stage for calculating a difference value between a desired output and an actual output, wherein said difference value includes said error;
    providing the error estimated to a second stage of said plurality of stages through an error amplifier after multiplying the error with said desired gain; and
    eliminating the error in said residue amplifier by adding the error to a residue value input to said second stage.

2. The method of claim 1 further comprising:
    holding the error estimated in a sampling capacitor of the first stage.

3. The method of claim 1, wherein the closed loop gain of said error amplifier is equal to the product of closed loop gains of the residue amplifiers of the first stage and the second stage.

4. The method of claim 1, wherein said providing the error calculated further comprising:
    multiplying the error with the closed loop gains of a set of residue amplifiers of successive stages before a particular stage; and
    providing the error to said particular stage.

5. The method of claim 1, wherein the error comprises gain error and settling error in the analog to digital converter.

6. The method of claim 1, whereby the error in the residue amplifier is corrected in analog domain.

7. The method of claim 1, wherein the analog to digital converter is a pipelined analog to digital converter.

8. An analog to digital converter including a plurality of stages, each of said stages comprising a residue amplifier, said analog to digital converter comprising:

an attenuator for dividing an output signal of a first stage by a desired gain of said residue amplifier of said first stage to generate a modified output signal;

means for adding a digital to analog converter (DAC) value to said modified output signal to generate a reconstructed input signal;

means for subtracting said reconstructed input signal from an input signal to the first stage for calculating a difference value between a desired output and actual output, wherein said difference value includes said error;

a sampling capacitor for holding the error calculated in the first stage;

an error amplifier for providing the error calculated to a second stage of said plurality of stages after multiplying the error with said desired gain; and means for adding the error to a residue value input to said second stage whereby correcting the error in the residue amplifier.

9. The analog to digital converter of claim 8, wherein the closed loop gain of said error amplifier is equal to the product of closed loop gains of the residue amplifiers of the first stage and the second stage.

10. The analog to digital converter of claim 8, further comprising:

means for multiplying the error with the closed loop gains of the residue amplifiers of successive stages before a particular stage; and means for providing the error to said particular stage.

11. The analog to digital converter of claim 8, wherein said error comprises gain error and settling error in the analog to digital converter.

12. The analog to digital converter of claim 8, wherein the analog to digital converter is a pipelined analog to digital converter.

13. A method comprising:

calculating a reference voltage error in a first stage of a plurality of stages in an analog to digital converter, said calculating comprising:

estimating a difference value between a reference voltage provided to said first stage and an ideal reference voltage; and multiplying said difference value with a closed loop gain of a residue amplifier of the first stage to calculate said reference voltage error;

providing the reference voltage error calculated to a second stage of the plurality of stages after multiplying the error with a closed loop gain of the residue amplifier of said second stage; and eliminating the reference voltage error by adding the error to a residue value input to the second stage.

14. The method of claim 13, wherein said providing the reference voltage error comprising:

multiplying the reference voltage error with the closed loop gains of a set of residue amplifiers of successive stages before a particular stage; and providing the reference voltage error to said particular stage.

15. An analog to digital converter including a plurality of stages comprising:

means for estimating a difference value between a reference voltage provided to a first stage of said plurality of stages and an ideal reference voltage;

means for multiplying said difference value with a closed loop gain of a residue amplifier of said first stage to calculate a reference voltage error;

means for providing said reference voltage error calculated to a second stage of the plurality of stages after multiplying the reference voltage error with a closed loop gain of the residue amplifier of said second stage; and means for eliminating the reference voltage error by adding the error to a residue value input to the second stage.

16. The analog to digital converter of claim 15, further comprising:

means for multiplying the error with the closed loop gain of the residue amplifiers of successive stages before a particular stage; and means for providing the error to said particular stage.

17. A method comprising:

calculating a reference voltage error in a first stage of a plurality of stages in an analog to digital converter, said calculating comprising:

estimating a difference value between a reference voltage provided to said first stage and an ideal reference voltage;

multiplying said difference value with a closed loop gain of a residue amplifier of the first stage to calculate said reference voltage error, wherein said difference value includes the reference voltage error;

digitizing the reference voltage error calculated using a digital logic after multiplying the reference voltage error with a closed loop gain of the residue amplifier of said second stage;

digitizing a residue value input to the second stage using an auxiliary analog to digital converter; and adding the digitized reference voltage error with the digitized residue value input using an error correction logic, thereby eliminating the reference voltage error.

18. The method of claim 17, further comprising:

multiplying the digitized reference voltage error with the closed loop gain of the residue amplifiers of successive stages before a particular stage; and providing the digitized reference voltage error to said particular stage.

19. The method of claim 17, wherein the analog to digital converter is a pipelined analog to digital converter.

20. The method of claim 17, whereby the reference voltage error in the residue amplifier is eliminated in digital domain.

* * * * *